United States Patent [19]

Inaba

[11] 4,258,381
[45] Mar. 24, 1981

[54] LEAD FRAME FOR A SEMICONDUCTOR DEVICE SUITABLE FOR MASS PRODUCTION

[75] Inventor: Kiyoharu Inaba, Kumamoto, Japan

[73] Assignee: Steag, Kernergie GmbH, Essen, Fed. Rep. of Germany

[21] Appl. No.: 966,861

[22] Filed: Dec. 6, 1978

[30] Foreign Application Priority Data

Dec. 7, 1977 [JP] Japan .................................. 52/147662

[51] Int. Cl.³ ..................... H01L 23/48; H01L 29/44; H01L 29/52
[52] U.S. Cl. ........................................ 357/70; 357/65; 357/68; 29/589; 29/591
[58] Field of Search ............... 357/70, 65, 68; 29/589, 29/591

[56] References Cited

U.S. PATENT DOCUMENTS

| | | | |
|---|---|---|---|
| 3,478,420 | 11/1969 | Grimes et al. | 357/70 |
| 3,611,061 | 10/1971 | Segerson | 357/70 |
| 4,125,740 | 11/1978 | Paletto | 357/70 |
| 4,138,691 | 2/1979 | Bonkohara | 357/80 |

FOREIGN PATENT DOCUMENTS 52-2168  1/1977  Japan ........................................ 357/70

Primary Examiner—Andrew J. James
Attorney, Agent, or Firm—Karl F. Ross

[57] ABSTRACT

A semiconductor chip lead frame may have universal application for mounting any of many different chip sizes. More particularly, an island for supporting the chip has a plurality of recesses at its peripheral side portions, opposed to the intervals between leads. By changing the depth of these recesses, the lead frame can be adapted to mount various semiconductor chips having different chip areas, thereby conforming the area encircled by the bottoms of the recesses with the area of a chip having the minimum chip area. An advantage is that the chip-supporting frame area which is to be plated can be reduced, at least by the area of the recesses. The heat dissipation efficiency of the lead frame is not harmed.

15 Claims, 8 Drawing Figures

LEAD FRAME FOR A SEMICONDUCTOR DEVICE SUITABLE FOR MASS PRODUCTION

The present invention relates to a lead frame to be used for the assembly of a semiconductor device, and more specifically, of an integrated circuit.

A configuration of lead frames, in the prior art, was such that there was an island at the center portion for mounting a semiconductor chip such as a transistor, diode, integrated circuit (IC), etc. a plurality of spaced apart leads were disposed to extend outwardly from the circumferential portion of the island, and a unit pattern of a lead frame for a semiconductor device was formed by the island and the plurality of leads. Normally, a plurality of such unit patterns were included in one sheet of metallic strip, and the shape of each island was rectangular and similar to a shape of a semiconductor chip. At present, there are a variety of semiconductor chips having different sizes according to their functions, such as a signal transistor, a power transistor, a diode, an integrated circuit (IC) including transistors and circuit elements (resistors and capacitors), a large scale integrated circuit (LSI) including a large number of transistors, diodes and circuit elements. Because chips have various different sizes, the islands of the lead frames must have also had various different sizes.

With regard to the manufacture of these lead frames, the lead frame was manufactured by stamping out a unit pattern from a metallic thin plate by employing a die with a first punch, which determines a shape and an arrangement of leads. Thereafter, a second punch was used to determine a shape and a size of an island. Accordingly, in order to manufacture a single lead frame pattern for producing one type of semiconductor device, at least two kinds of punches and dies were required. Furtheremore, upon manufacturing lead frames having different island sizes, the lead frames must be shaped while interchanging these two kinds of punches and dies. Therefore, in order to manufacture a great number of lead frames having different island sizes as described above, the need for pairs of two kinds of punches and dies for each size required a large number of pairs.

This led to a great disadvantage since not only the cost for producing the punches and dies was increased, but also the manufacturing process of the lead frames was made complex and troublesome.

In addition, the island portions were plated with expensive precious metal such as, for example, gold in order to enhance bonding strength, electrical conductivity and heat dissipation when a chip is mounted on the island. As the chip area was increased, the island size was also enlarged, so that the plating area was inevitably increased. Accordingly, there was an economical shortcoming that a large amount of the expensive precious metal was required resulting in increase of a manufacturing cost.

Therefore, one object of the present invention is to provide a novel shape lead frame which can be manufactured with a small number of varieties of punches and dies even if the sizes of the islands are varied in many fashions.

Another object of the present invention is to provide a low cost lead frame having a small island area in comparison to an increased chip area without a decrease in the bonding strength between the chip and the island.

Still another object of the present invention is to provide a method for manufacturing lead frames with various island areas, which method is suitable for mass-production.

In order to achieve the aforementioned objects, the lead frame according to the present invention is characterized by a basic structure wherein the island has a plurality of recesses at its peripheral side portions opposed to the intervals between leads.

The lead frame according to the present invention can mount various semiconductor chips having different chip areas merely by changing the depth of recesses formed at the peripheral side. More particularly, the lead frame according to the present invention can be used in common to mount various semiconductor chips having different areas by conforming the area encircled by the bottoms of the recesses of the island to the area of the chip having the minimum chip area. Furthermore, there is an advantage since the area to be plated can be reduced at least by the area of the recesses. The efficiency of the heat dissipation is not harmed, if the area of recesses is not too large.

The above-mentioned and other objects, features and advantages of the present invention will become more apparent by reference to the following detailed description taken in conjunction with the accompanying drawings, in which.

Figure 1:
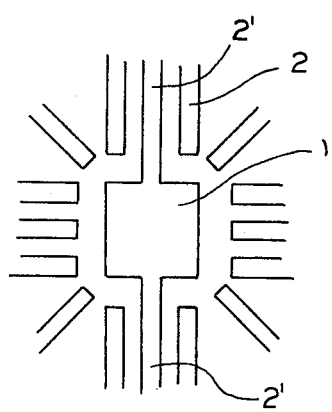
FIG. 1 is a partial plan view showing a unit pattern of a lead frame in the prior art.

Referring now to FIG. 1, a unit pattern of a lead frame in the prior art has, at its center, an island 1 for mounting a semiconductor chip (transistor, diode, IC, etc), and around the island are provided a plurality of outwardly extending leads 2. Normally, the width of the leads 2 is 0.3–0.4 mm; its thickness is 0.25 mm; and the size of the island 1 is varied from 3 mm × 3 mm to 7.5 mm × 7.5 mm depending upon the size of the semiconductor chip to be mounted thereon.

Figure 2:
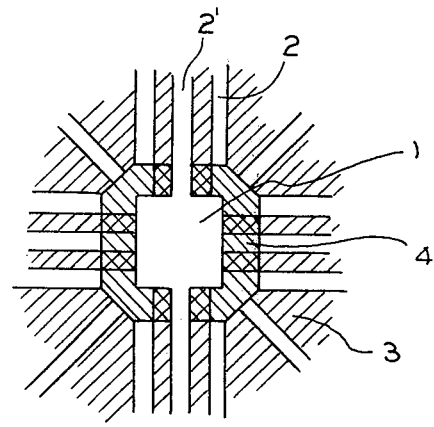
FIG. 2 is a partial plan view of a lead frame and punches showing a process for producing a lead frame in the prior art.

The formation of the island 1 and the leads 2, in the lead frame in the prior art, is made by means punches and dies. FIG. 2 shows the relationship of the island 1, the leads 2 and punches 3 and 4. The leads 2 and the island 1 were formed by progressive dies and by twice operating a punch press. That is, a metal strip is stamped by a punch 3 having the shape represented by hatchings inclined from upper right downwardly toward lower left, as viewed in FIG. 2. Thereafter, the metal strip is stamped by another punch 4 having the shape represented by hatchings inclined from upper left to downwardly toward lower right. In other words, the shape of the leads 2 and the maximum size of the island 1 were determined by the punch 3, and subsequently, the formation of the island 1 having a predetermined area and the separation between the island 1 from the respective leads 2 were simultaneously performed by the punch 4. The leads 2' remain connected to the island 1 for mechanically supporting the island 1. The shape of the island 1 is generally a square.

Figure 3:
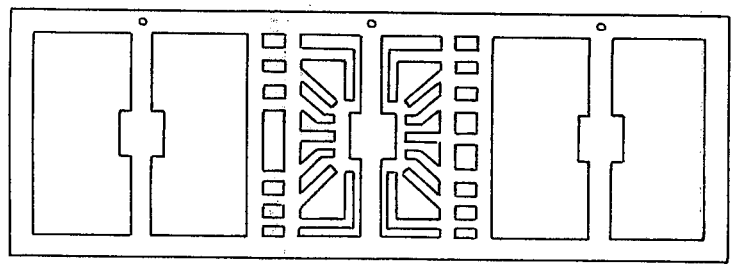
FIG. 3 shows an appearance of a lead frame in the prior art.

While the lead frame shown in FIG. 1 was manufactured by the above-mentioned process, the leads 2' for supporting the island 1 do not always have to be formed in two leads. A lead frame may be of the type in which a rectangular island is supported by a single lead as shown, for example, in FIGS. 1 and 2 of U.S. Pat. No. 3,611,061. These unit patterns of lead frames are formed in multiple on a single metal strip as shown in FIG. 3.

However, if it is necessary to change the area of the island 1, then both the punches 3 and 4 must be replaced by other punches having different shapes. Otherwise, an island having a required area cannot be obtained. Heretofore, when the size of the island 1 was varied, the corresponding press dies were also required, and so, a large expense of ten to thirty million yens and a long period (three to five months) were required for manufacturing the punches and the press dies.

In addition, since the sizes of the semiconductor chips to be mounted on the island 1 were varied in different manners, a requirement could not be quickly satisfied unless a large number of pairs of punch and die were previously prepared. Therefore there was a disadvantage since not only a large expense was required but also the process for manufacturing the lead frame was complex and troublesome. Furthermore, the lead frame in the prior art also had a disadvantage since as the island is enlarged, the cost becomes higher due to the increase of the area to be plated with precious metal such as gold.

Figure 4:
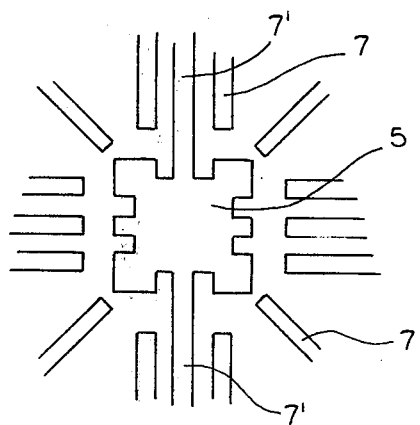
FIG. 4 is a partial plan view showing a unit pattern of a lead frame according to one preferred embodiment of the present invention.

FIG. 4 shows a unit pattern of a lead frame according to a first preferred embodiment of the present invention. This pattern comprises an island 5 at its center portion for mounting a semiconductor chip (transistor, diode, IC, etc.) thereon to be fixedly secured thereto by soldering, and leads 7 are positioned around the island 5 for completing to electrical connection with external circuits, similarly to the lead frame in the prior art. In addition, along the periphery portions of the island 5 are formed protrusions and recesses of a comb shape. Leads 7' serve to support the island 5, and are normally used as an input or output terminal in a discrete transistor or as a ground terminal in an IC.

Now the process for manufacturing the lead frame according to the above-described embodiment of the invention will be described with reference to FIGS. 5 and 6.

Figure 5:
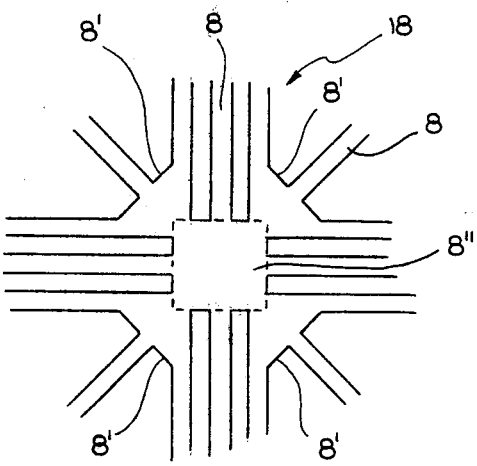
FIG. 5 is a partial plan view showing an intermediate step in the manufacture of the lead frame according to the present invention.

A metal strip is stamped into the shape of the frame 18 in FIG. 5 by means of a first punch. In this step, a plurality of leads 8 and a center portion 8" of the island are connected together. The center portion 8" of the island has an area equal to that of the minimum chip size applicable thereon. At the edges of the center portion 8", triangle regions 8' are provided. These triangle regions 8 enable the extension of the island area from the center portion 8".

Figure 6:
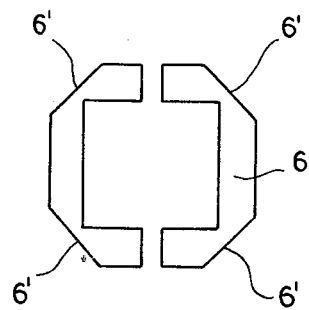
FIG. 6 is a schematic view showing one example of punches necessitated for the manufacture of the lead frame according to the present invention.

Next, the stamping work is effected again by means of a second punch 6 shown in FIG. 6. In this case, the stamping is effected by aligning four edges 6' of the punch 6 with the outer edges of the triangle region 8' or by registering the punch 6 with the frame 8 so as to somewhat overlap with each other. Thus, by the second punch 6, all the leads 8 except for one or two for supporting the center portion 8" are separated from the center portion 8" and a square island is formed. The square island comprises the center portion 8" and respective parts of the triangle region 8' and leads 8. Protrusions and recesses are formed in a comb shape around center protion 8".

Figure 7:
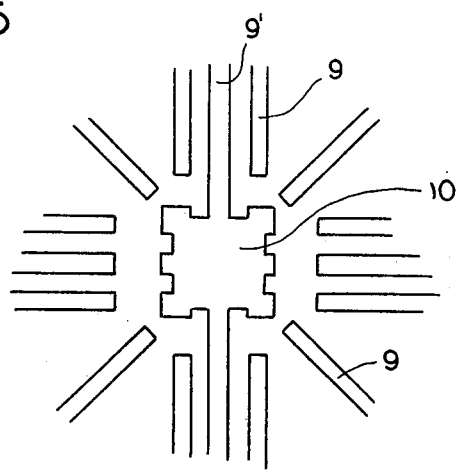
FIG. 7 is a partial plan view showing a unit pattern of a lead frame according to another preferred embodiment of the present invention.

In this way, the shape of the lead frame shown in FIG. 4 can be obtained, and the island 5 can be formed in various sizes by merely replacing the punches 6 of different sizes. For instance, by stamping the frame 8 with a second punch 6 having a small-sized inner aperture, it is possible to stamp out the island 10 so as to have shallow recesses formed along its periphery, as shown in FIG. 7. The distance between the protrusion of the island 10 and the tap ends of the leads 9 is elongated, but the distance between the tap ends of the opposed leads 9 is not changed. The leads 9' are provided for supporting the island 10.

As above mentioned, in the frame 18 in FIG. 5 stamped out by the first punch, if the area of the center portion 8" of the island is preset approximately equal to the area of the minimum semiconductor chip, then the lead frame applicable to all the semiconductor chip can be obtained by changing the size of the recesses. This change of recesses is achieved by merely replacing only the second punch 6, and can be obtained with a manufacturing cost, for the second punch 6, of only several tens of thousand yens and a short working period (only about one day of work) is required for replacement of the punch, as distinguished from the manufacture of the new first and second punches and corresponding dies in the prior art. Especially, among the new punches and dies in the prior art, the first punch 3 required, for its manufacture, an expense of ten to thirty million yens and a period of three to five months, whereas according to the present invention the large expense and the long period for manufacture of the punch and dies can be saved because the first punch can be used in common to the manufacture of every lead frame.

The lead frame according to one preferred embodiment of the present invention shown in FIG. 4 is designed so as to mount thereon a semiconductor chip having the size of 7.5 mm×7.5 mm, and to have a width of leads 7 of 0.3 mm, a width of leads 7' of 0.4 mm and a thickness of leads 7, 7' of 0.15 mm, the area of the center portion 8" of the island 5 being equal to 4.5 mm×4.5 mm, the size of the outer profile of the protrusions being selected equal to 7.6 mm×7.6 mm, and the gap distance between the leads 7 and the island 5 was selected equal to 0.35 mm. The depth of each recess was equal to 1.5 mm. As the material for the leads 7 and the island 5, copper or iron-alloy (iron-nickel alloy) is employed.

Figure 8:
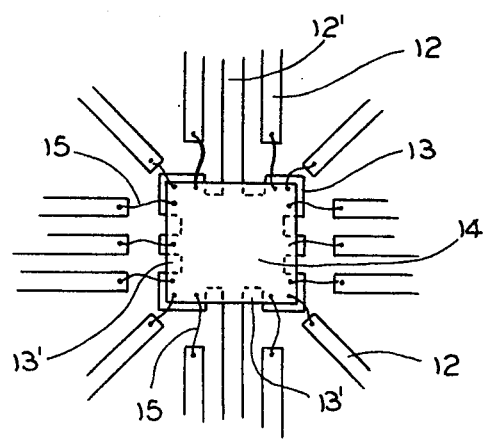
FIG. 8 is a partial plan view showing the lead frame according to the present invention, with a chip mounted on the lead frame and with connections extending between the chip and leads.

FIG. 8 shows a completed state of the lead frame according to the aforementioned embodiment, in which a semiconductor chip 14 of 7.5 mm×7.5 mm is fixedly secured onto its island 13, and electrode lead out portions (bonding pads) of the chip 14 and respective leads 12 are connected with bonding wires 15. In this figure, the portions 13' represented by dotted lines within the chip 12 are the recessed portions of the island 13. While the portions corresponding to these portions 13' were simultaneously plated when the island 13 was plated in the lead frame in the prior art, the gold plating of these portions would become unnecessary according to the present invention. Accordingly, the amount of expensive precious metal can be reduced, and so, the present invention is economically very advantageous.

The dimensions of the various portions of the lead frame according to the present invention are not limited to those given in the above-described embodiments. The depth of the recesses should be preferably 27% or less of the length of the side of the island including said recesses, in view of a need for heat dissipation efficiency for the semiconductor chip to be subsequently mounted thereon and for the mechanical strength of the peripheral portion of the island. In addition, while the depth of the recesses formed along the periphery of the island is varied in many kinds depending upon the area of the semiconductor chip, most varieties of the chips heretofore used have the sizes of 3 mm×3 mm to 7.5 mm×7.5 mm. Accordingly, the depth of the recesses could be preset at 2 mm or less. If the depth exceeds such values, then the lead frame would become practically unavailable in view of a bonding strength between the island and a chip, a heat dissipation effect of a chip and a mechanical strength of the island.

As the metal to be plated, not only gold but also the conventional plating metals such as silver, platinum, etc. may be employed, and the width and thickness of the leads may be appropriately varied.

While the structure for supporting the island with two leads 12' or 9' is employed in the above-described embodiment, these supporting leads need not be limited to two. They may be provided singly or in more than two. In addition, the shape of the recesses is not limited to a square or a rectangular, but they could be cut away in any arbitrary shape. Accordingly, so long as the bonding strength between the island and a chip and the heat dissipation effect are good, a shape having recesses only at the corner portions of the square or rectangular island may be employed. In such case, stamping of the lead frame can be achieved merely by modifying the shape of either the second punch 6 or the first punch 3.

What is claimed is:

1. A lead frame for a semiconductor device comprising:
a planar island portion adapted to carry a semiconductor chip thereon and having recesses and protrusions formed to extend outwardly in the plane of the island and along the contours of its peripheral side portions, and a plurality of leads spaced apart from said island portion and extending outwardly from the neighborhood of said island portion, top edges of said leads facing and being generally parallel to the protrusions between said recesses of said island portion.

2. A lead frame as claimed in claim 1, in which said island portion has a substantially rectangular shape with protrusions formed at the corners of said rectangular shape.

3. A lead frame as claimed in claim 1, in which the length of said recesses as measured from the side of said island to the central area of said island is equal to 27% or less of the width between the opposing sides of said island.

4. A lead frame for a semiconductor device comprising a metallic strip stamped a first time to form an island portion adapted to have a semiconductor element mounted thereon and a plurality of lead portions for enabling electrical connections to be made to external circuits, and said strip having a second area restamped from said strip which was stamped said first time in order to separate said island portion from said lead portions and to form recesses along the peripheral side portions of said island portion as opposed to the area between said lead portions.

5. A lead frame as claimed in claim 4, in which said island portion is separated from most of said plurality of lead portions during said restamping, at least one of said lead portions remaining intact after said restamping in order to provide mechanical support for said island portion.

6. A universal lead frame blank, comprising:
a. a mounting frame initially stamped by one universal punch and die from a thin metal strip, as initially stamped said universal lead frame having a relatively large central island with a plurality of lead lines extending therefrom; and
b. means on said central island for giving said universal lead frame a selected dimensioned responsive to a restamping to fit a particular type of semiconductor device, said said dimensioned island having a mechanical separation between said island and all of said lead lines except for at least one of said lead lines which provides a mechanical support for said island, whereby the same universal frame may be restamped to receive different semiconductor types by a restamping process.

7. The frame blank of claim 6 and recesses formed along the periphery of said dimensioned island to increase the distance between the island perimeter and the separated ends of said lead lines.

8. The frame blank of claim 7 wherein the dimensioned island accepts different semiconductor types according to a selection of recess sizes.

9. A semiconductor device comprising a lead frame and a semiconductor chip mounted on a generally planar chip mount portion of said lead frame, said lead frame being initially made in a universal dimension and thereafter tailored to a specific semiconductor chip dimension by cutting away lead frame material in a selected one of several alternative configurations, and the edges of said lead frame being selectively recessed within the plane of said chip mount portion and along the peripheral edge areas of the predetermined chip-mount portion of said lead frame to minimize the area where the chip is supported by said chip mount portion.

10. The device of claim 9 and precious metal plating on said minimized area of said lead frame.

11. A combination comprising:
a. a metal support member having a plurality of recesses and protrusions along its periphery;
b. a semiconductor chip mounted on said metal support member, a peripheral portion of said semiconductor chip being positioned to overlap at least a portion of said protrusions and to cover at least a portion of said recesses; and
c. a plurality of external lead-out members electrically connected to regions of said semiconductor chip.

12. A combination as claimed in claim 11, said protrusions of said metal support member being in alignment with and spaced from said external lead-out members, both said external lead-out members and said metal support member being made of the same conductive metal.

13. A combination as claimed in claim 11, wherein said plurality of external lead-out members are positioned to surround said metal support member, at least one external lead-out member being integrated with said metal support member and the other of said lead-out members being separated from said metal support member.

14. A combination as claimed in claim 13, and other lead-out members being in alignment with the opposite protrusions of said metal support member and electrically connected to the regions of said semiconductor chip via bonding wires.

15. A lead frame for a semiconductor device comprising:

a. a plurality of metallic lead strips extending inwardly into an opening;
b. a metallic island member positioned in said opening for carrying a semiconductor chip thereon; and
c. a metallic strip member supporting said island member and formed integrally with said island member, said strip member, said island member and said lead strips being made of the same material, said island member having a plurality of recesses and protrusions along its periphery, each of said protrusions being in alignment with and laterally separated a predetermined distance from said lead strips, and said protrusion having a length dependently on a size of said semiconductor chip.

* * * * *

UNITED STATES PATENT AND TRADEMARK OFFICE
CERTIFICATE OF CORRECTION

PATENT NO. : 4,258,381
DATED : March 24, 1981
INVENTOR(S) : Kiyoharu Inaba

It is certified that error appears in the above—identified patent and that said Letters Patent is hereby corrected as shown below:

On the title page the assignee should read as follows:

-- Nippon Electric Co., Ltd.,
Tokyo, Japan --.

Signed and Sealed this

Second Day of June 1981

[SEAL]

Attest:

RENE D. TEGTMEYER

Attesting Officer

Acting Commissioner of Patents and Trademarks